(12) United States Patent
Buchel et al.

(10) Patent No.: US 8,692,460 B2
(45) Date of Patent: Apr. 8, 2014

(54) HIGHLY DOPED ELECTRO-OPTICALLY ACTIVE ORGANIC DIODE WITH SHORT PROTECTION LAYER

(75) Inventors: Michael Buchel, Eindhoven (NL); Dietrich Bertram, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 576 days.

(21) Appl. No.: 12/373,536

(22) PCT Filed: Jul. 13, 2007

(86) PCT No.: PCT/IB2007/052802
§ 371 (c)(1),
(2), (4) Date: Jan. 13, 2009

(87) PCT Pub. No.: WO2008/010171
PCT Pub. Date: Jan. 24, 2008

(65) Prior Publication Data
US 2009/0174323 A1    Jul. 9, 2009

(30) Foreign Application Priority Data
Jul. 19, 2006   (EP) .................................. 06117443

(51) Int. Cl.
*H01L 51/54* (2006.01)
(52) U.S. Cl.
USPC .......................................... 313/509; 313/504
(58) Field of Classification Search
USPC .................................................. 313/504, 498
See application file for complete search history.

(56) References Cited

U.S. PATENT DOCUMENTS

| | | |
|---|---|---|
| 6,525,466 B1 | 2/2003 | Jabbour et al. |
| 2004/0062949 A1 | 4/2004 | Pfeiffer et al. |
| 2004/0251815 A1 * | 12/2004 | Tokailin et al. ............... 313/503 |
| 2005/0040390 A1 | 2/2005 | Pfeiffer et al. |
| 2005/0112881 A1 | 5/2005 | Prakash et al. |
| 2005/0158579 A1 * | 7/2005 | Marks et al. .................. 428/690 |
| 2006/0033115 A1 | 2/2006 | Blochwitz et al. |
| 2007/0020484 A1 * | 1/2007 | Kim et al. ...................... 428/690 |
| 2007/0200123 A1 * | 8/2007 | Yamamichi et al. ............ 257/89 |

FOREIGN PATENT DOCUMENTS

| | | | |
|---|---|---|---|
| EP | 0949696 A2 | | 10/1999 |
| EP | 1496041 A1 | | 1/2005 |
| JP | 2005044799 A | | 2/2005 |
| WO | 2005064995 A1 | | 7/2005 |
| WO | WO 2005/086539 | * | 9/2005 |

OTHER PUBLICATIONS

Soon Moon Jeong et al; "Improved Stability of Organic Light-Emitting Diode With Aluminum Cathodes Prepared by Ion Beam Assisted Deposition", Science and Tech. of Advanced Materials, vol. 6, 2005, pp. 97-102.

* cited by examiner

*Primary Examiner* — Andrew Coughlin
(74) *Attorney, Agent, or Firm* — David Zivan; Mark Beloborodov

(57) ABSTRACT

An electro-optically active organic diode has anode and cathode electrodes, an electro-optically active organic layer between the electrodes, and a charge carrier organic layer between the electro-optically active organic layer and the cathode electrode layer. The charge carrier organic layer is formed of a highly doped organic semiconductor material. A short protection layer is arranged between the cathode electrode layer and the charge carrier organic layer. The short protection layer is formed of an inorganic semiconductor material.

10 Claims, 2 Drawing Sheets

HIGHLY DOPED ELECTRO-OPTICALLY ACTIVE ORGANIC DIODE WITH SHORT PROTECTION LAYER

This application is a national stage application under 35 U.S.C. §371 of International Application No. PCT/IB2007/052802 filed on Jul. 13, 2007, and published in the English language on Jan. 24, 2008, as International Publication No. WO/2008/010171, which claims priority to European Application No. 06117443.9, filed on Jul. 19, 2006, incorporated herein by reference.

FIELD OF THE INVENTION

The present invention relates generally to electro-optically active organic diodes, such as used in organic solar cells and as organic light emitting diodes (OLEDs). More specifically it relates to an electro-optically active organic diode comprising an anode electrode, a cathode electrode, an electro-optically active organic layer arranged between the electrodes, and a charge carrier organic layer formed of a highly doped organic semiconductor material.

BACKGROUND OF THE INVENTION

Electro-optically active organic diodes are for example used as organic light emitting diodes (OLEDs), in lightning devices, in display devices and in organic solar cell devices. An organic diode in an organic solar cell device is arranged to generate electricity from light, whilst in a lightning device, the organic diode is arranged to generate light from electricity. Nevertheless, these are just different manifestations of common fundamental properties pertaining to certain electro-optically active organic materials. Progress and development in one area, such as in the area of lightning devices and OLEDs, thus can be utilized for improvements in the other area, such as in the area of organic solar cell devices.

This far, efforts mostly have been spent on lightning devices, and in particular on OLEDs. This is partly owing to that the obtainable efficiency, reliability and operational life-time so far have been considered too poor for viable organic solar cell devices, especially in light of what can be achieved in conventional solar cell devices. Although these properties are desirable to improve also in the area of lightning application devices, the requirements are often not fully as high, and there are already commercially available products, such as displays based on OLED technology. Partly, this is owing to that OLEDs emit light and thus do not require backlighting such as in conventional liquid crystal displays (LCDs). Some other advantages of electro-optically active organic diodes in general are for example that they are comparatively easy and cost efficient to make, can be fabricated in thin, flexible layers and even be made transparent.

Recently there has been progress in efficiency by use of highly doped organic semiconductor materials, in particular for use as charge carrier layers, such as transport layers in OLEDs.

For example, US 20050040390 presents doped organic semiconductor materials that can be used to improve OLEDs. The materials have enhanced charge carrier density and effective charge carrier mobility. The doping is achieved by doping an organic semiconductor material with organic molecules, which, for example, allow doping of polymer layers with large, non-mobile molecules.

Further, US 20060033115 discloses a transparent light emitting organic diode component using highly doped organic layers as transport layers for holes and electrons. The transport layers are arranged adjacent to electrodes. Dopants are organic molecules with molecular masses above 200 g/mole. Doping concentrations are in the range between 1:10 and 1:10000.

Although highly doped organic semiconductor layers and materials indeed look promising and can result in great efficiency improvements and very power efficient devices based on electro-optically active organic diodes, problems with reliability is a remaining problem and can be an obstacle for commercial success of devices employing these layers and materials.

SUMMARY OF THE INVENTION

It is an object of the present invention to overcome or at least alleviate problems in the prior art. A specific object is to improve reliability of electro-optically active organic diodes comprising charge carrier layers of highly doped organic semiconductor material. The invention is defined by the appended independent claims. Preferred embodiments are set forth in the dependent claims and in the following description and drawings.

Although there is no wish to be bound by any particular theory, the invention is partly based on the discovery that one large contributor to unreliable conventional electro-optically active organic diodes, especially such of large areas, and in particularly such that employ charge carrier layers of highly doped organic semiconductor material, seems to be shorts that occur between cathode and anode electrodes, and the extent of damage such shorts have on the organic material arranged in between. It further seems like one factor contributing to these shorts is the occurrence of high field strengths in the cathode owing to unintentional physical defects in the cathode, especially defects having sharp edges, which can give rise to very high, local field strengths. The sharp edges may for example be located at pinholes or at a rough or damaged (e.g. due to undesired presence of particles), or in any other way defect surface area of the cathode. A result from increased field strength may be locally raised temperatures and sometimes softening and melting cathode material. Since the organic materials used in electro-optically active organic diodes, and organic materials in general, only can withstand comparatively low temperatures and often have a comparatively low melting/pyrolysis temperature, the raised temperatures may cause the organic layer material to degrade and/or soften, which in combination with the often high electro-static pressure of many bars between cathode and anode, seem to increase the risk of damaged organic material and a short to occur between the cathode and anode through the organic material, typically at spots where the organic layer, for example due to the above reason, has become very thin, or damaged in any other way. As a result there can be relatively high currents, which lead to even higher temperatures and greater damage.

Hence, the above-mentioned and other objects that will be evident from the following description, are achieved by an electro-optically active organic diode comprising an anode electrode layer, a cathode electrode layer, an electro-optically active organic layer arranged between the electrodes, and a charge carrier organic layer arranged between said electro-optically active organic layer and said cathode electrode layer, and adjacent to said electro-optically active organic layer, wherein said charge carrier organic layer is formed of a highly doped organic semiconductor material. A short protection layer is arranged between said cathode electrode layer and said charge carrier organic layer, and adjacent to said cathode electrode layer, wherein said short protection layer is formed of an inorganic semiconductor material.

"Electro-optically active" here refers to the ability to transform light to electricity, and/or electricity to light. When it is used to describe a layer it typically means that the layer comprises a material, for example in form of a sub-layer, that has this ability and when used to describe a diode it typically means that the layer comprises a material, for example in form of a layer, that has this ability, which for example is the case for an organic light emitting diode (OLED).

An "anode electrode" typically is an electrode for hole injection, e.g. in the form of a base layer deposited on a carrier or substrate.

A "cathode electrode" typically is an electrode for electron injection, e.g. in the form of a deposited top layer.

The short protection layer prevents direct contact between the cathode layer and the charge carrier organic layer, which reduces the risk that the cathode layer will have detrimental impact on the charge carrier organic layer, and this, in turn, reduces the risk of a short to occur between the cathode and the anode. An inorganic material is typically not as sensitive as an organic material and it is thus better suited for protective purposes. Moreover, a semiconductor material typically has good transparency, which is a desirable property for a layer arranged between the cathode electrode and organic layers.

The short protection layer may be conducting. When the inorganic semiconductor forms the short protection layer, i.e. typically after being deposited by thermal evaporation, the layer is typically conducting, although less conducting than the cathode, and in spite of that the material used per se is a semiconductor. Being conductive allows for thicker layers, which is beneficial for protection purposes. Better conductivity typically means that thicker layers are possible and thus better short protection. The thickness can be used to achieve a conduction that is beneficial for reducing currents that tend to increase and be detrimental in a situation of an imminent short.

The inorganic semiconductor material preferably has a higher melting temperature than the material of the cathode layer. This allows the organic diode to better withstand a situation where heat is developed that risks to melt the electrode material. A short protection layer that remains intact and rigid in such a situation further protects the charge carrier organic layer from getting in direct contact with the electrode material and distributes the force and pressure exerted on the organic layers over a large surface, which reduces the risk of compressed and damaged organic layers.

The inorganic semiconductor material may have a band gap greater than 2.7 eV, and preferably greater than 3 eV. This means that blue electro luminescence may not be absorbed and that thus generation of photoelectrons is not possible at an interface between the short protection layer and the charge carrier organic layer. Further, the short protection layer will be stable against hot electrons that may be generated at the interface between the short protection layer and the cathode layer. Photoelectrons are thermalised in the short protection layer and thus may not damage the organic layer. An advantageous side effect with a band gap greater than about 2.7 eV is that the short protection layer also will serve as a exciton blocking layer.

The inorganic semiconductor material may have an electron affinity between 0.5 eV and 3.5 eV. This can adapt and minimize the injection barrier for electrons into the lowest unoccupied molecular orbital (LUMO) of the charge carrier organic layer, and the short protection layer may additionally act as an electron injection layer.

The inorganic semiconductor material may have a dielectric constant>1, preferably >10, and more preferably >30. Materials of a high dielectric constant reduces the field strength at for example sharp edges of a defect and thus help to decrease the risk of high field strengths that ultimately may lead to a short.

The inorganic semiconductor material may comprise a chalcogenide or binary oxide of an alkali earth metal or lanthanide, preferably BaO, BaSe, $La_2O_3$ or $Ce_2O_3$.

The short protection layer may have a thickness of at least 50 Å, preferably above 200 Å.

There may be a cover layer of a substantially inert material with respect to a cathode layer material in contact with said cover layer, and said inert material can be deposited on said surface of the cathode layer so that the complete surface is covered and surface defects eliminated. When the cover layer is deposited and covers the cathode surface, surface defects, such as pin holes, other voids and sharp defects, become filled and covered, and the risk of high field strengths to occur at such defects is reduced. This reduces the risk of conditions that may lead to a short. In case there is still a situation of an imminent short, the short protection layer reduces the risk of detrimental impact on the organic layer and the risk of a short to occur between the cathode and the anode.

There may be a lightning device, such as a lamp, a display device or an organic solar cell device which comprises the electro-optically active organic diode.

BRIEF DESCRIPTION OF THE DRAWINGS

This and other aspects of the present invention will now be described in more detail, with reference to the appended drawings showing currently preferred embodiments of the invention.

FIG. 2a schematically shows, by way of example, a cross-sectional view of a bilayer electro-optically active organic layer in an electro-optically active organic diode as of FIG. 1.

FIG. 2b schematically shows a cross-sectional view of a bilayer that is an alternative to the organic layer showed in FIG. 2a.

DESCRIPTION OF PREFERRED EMBODIMENTS

Figure 1:
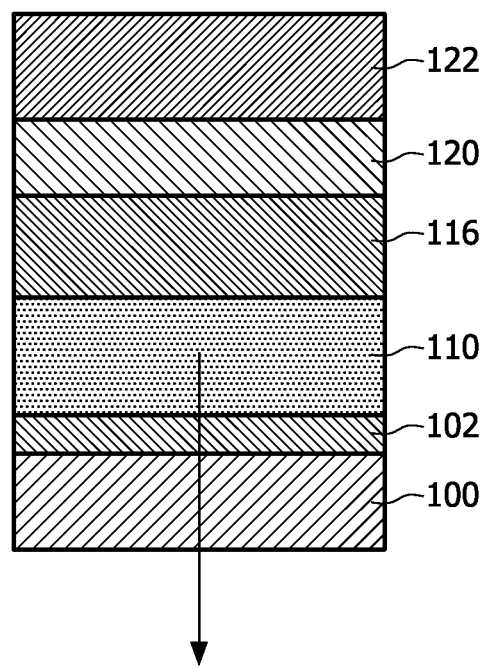
FIG. 1 schematically shows a cross-sectional view of layers in an electro-optically active organic diode according to an embodiment.

FIG. 1 schematically shows a cross-sectional view of layers in an electro-optically active organic diode according to an embodiment. The organic diode comprises a substrate 100, an anode layer 102, an electro-optically active organic layer 110, a charge carrier organic layer 116, an inorganic short protection layer 120 and a cathode layer 122.

The substrate 100 is typically transparent and may for example be made of a ceramic, e.g. glass or silicon, a plastic or a metal. The substrate may be rigid or flexible.

The anode layer 102 is a hole-injecting layer, typically of a relatively high work function and electrically conducting material, and is typically transparent in order to let light through, which is indicated by an arrow in FIG. 1. One currently predominant example of a transparent material suitable for the anode layer is indium tin oxide (ITO). Other examples include metals, metal oxides, doped inorganic semiconductors, doped conducting polymers or small molecules etc. The thickness of the anode layer 102 is typically in the range of about 100 Å to 3000 Å. The anode layer 102 may be deposited on the substrate 100 by any of a variety of depositing techniques for thin films known in the art, for example, vacuum evaporation, sputtering, electron beam deposition or chemical vapor deposition.

The electro-optically active organic layer 110 may comprise sub layers, but at least one active, emissive/absorbing layer for transformation of electricity to/from light. The total thickness of the organic layer 110 may be above about 500 Å, but preferably above 1000 Å.

It may be noted that a smoother underlying surface, for example the anode layer or the substrate, in general allows for a thinner organic layer.

Structure and materials of the organic layer 110 will be further discussed in connection with FIGS. 2a and 2b.

In FIG. 1, an arrow indicates that light is emitted from the organic layer 110 and that light passes out through the anode 102 and substrate 100. It may be noted that in alternative embodiments, the emitted light instead is let out through a transparent cathode or through both cathode and anode, and in other alternative embodiments there may instead be absorption of light.

The charge carrier organic layer 116 is of a highly doped organic semiconductor material, which typically has a doping concentration in the range of 1:10000 to 1:10. Dopants may be organic molecules or fragments thereof. The organic molecules used for doping typically have a molecular mass of 200 g/mole or more. In practice, an upper limit is typically 1200 g/mole.

When the charge carrier organic layer 116 is arranged between the electro-optically active organic layer 110 and the cathode layer 122, as in FIG. 1, it is typically used as an electron injection and/or transport layer, and the highly doped organic semiconductor material is n-doped.

In alternative embodiments, another charge carrier organic layer is arranged between the electro-optically active organic layer 110 and the anode layer 122, typically for use as an hole injection and/or transport layer, and the highly doped organic semiconductor material is p-doped.

Examples of highly doped organic semiconductor materials include for example 1,4,2,8-naphthalene tetra carboxylic dianhydride (NDTCA) doped with tetraethyl pyronin chloride.

Because of the high doping, thicknesses of highly doped charge carrier organic layers typically can be greater than what is practically achievable with undoped charge carrier layers. The thickness may be up to, for example, 1000 Å or more.

The charge carrier organic layer 116 can be deposited using any conventional techniques for depositing such a layer, which include, for example, thermal evaporation or organic vapor phase deposition. When the charge carrier layer 116 is deposited on the electro-optically active organic layer 110, care should be taken not to damage the electro-optically active organic layer. However, since both layers are organic, this is typically not a problem.

The short protection layer 120 is of an inorganic semiconductor material that may have an electron affinity between about 0.5 eV and about 3.5 eV, a bandgap greater than about 2.6 eV, and preferably greater than about 3 eV and a melting point that is higher than the melting point of the cathode layer 122 material.

Materials that have been found to be suitable for the short protection layer 120 are, for example, included in the chalcogenides or binary oxides of alkali earth metals or lanthanides, for example barium oxide (BaO), barium selenide (BaSe), lanthanum oxide ($La_2O_3$) and cerium oxide ($Ce_2O_3$). When the exemplified materials are forming the short protection layer 120, e.g. after being deposited by thermal evaporation, there are typically vacancies of O or Se, and thus oxygen deficiency or selenium deficiency, which may be one reason behind that the short protection layer, although formed of per se undoped semiconductor materials, exhibit a conductivity that allow for comparatively thick layers.

Other examples may include mixtures involving chalcogenides and/or binary oxides of alkali earth metals, or lanthanides, or mixtures of chalcogenides and/or binary oxides of alkali earth metals with low electron affinity metals, such as alkali metals, alkali earth metals and/or lanthanides.

The dielectric constant of the inorganic semiconductor material may be greater than 1, for example greater than 10 or even 30. BaO, for example, has a dielectric constant of about 34. The thickness of the short protection layer 120 may be in the range of about 10 Å to 50000 Å, preferably in the range of about 50 Å to 10000 Å, and typically in the range of about 100 Å to 1000 Å. Often a thickness of at least 200 Å is desired.

When the short protection layer 120 is deposited on the charge carrier organic layer 116, this should be done in a way that is non-detrimental for the charge carrier organic layer. Such methods for depositing the short protection layer 120 include, for example, thermal evaporation. In case of a binary oxide of an alkali earth metal or lanthanide, such as BaO, $La_2O_3$ and $Ce_2O_3$, the short protection layer 120 may be created by first depositing the alkali earth metal or lanthanide, for example by thermal evaporation, and then perform an in situ oxidation, for example by dosing oxygen into a vessel that has been used for the evaporation, to transform the alkali earth metal or lanthanide into a corresponding binary oxide. This may be particularly useful when the temperature needed for direct thermal evaporation of the binary oxide is very high.

The cathode layer 122 is typically a metallic material or a metal and may be a material having a comparatively low work function. However, in order to be environmentally stable and less reactive, typically a material is selected that has higher work function and is more stable, or a low work function material may be alloyed or combined with a more stable material. Examples of materials of a low work function are calcium (Ca), Magnesium (Mg) and Barium (Ba). Examples of materials of higher work function, but that are more stable, are aluminum (Al), copper (Cu) or silver (Ag). When light is to be passed via the anode and not via the cathode, the material of the cathode should typically be a good mirror, i.e. be reflective to the light in question. For example, Al and Ag is considered as good mirror materials in this context. A not so low work function of the cathode may to some extent be compensated for by the short protection layer 120, which additionally may act as an electron-injecting layer. When a highly doped charge carrier layer 116 is positioned between the electro-optically active organic layer 110 and the cathode layer 122, as in FIG. 1, the charge carrier layer 116 may be strongly electron injecting, which thus allow for materials of the cathode layer 122 that may have an even higher work function.

The thickness of the cathode layer 122 may be in the range of about 300 to 10000 Å. The cathode layer 122 may be deposited on the short protection layer 120 by any one of a number of conventional techniques including for example thermal evaporation.

Figures 2A, 2B:
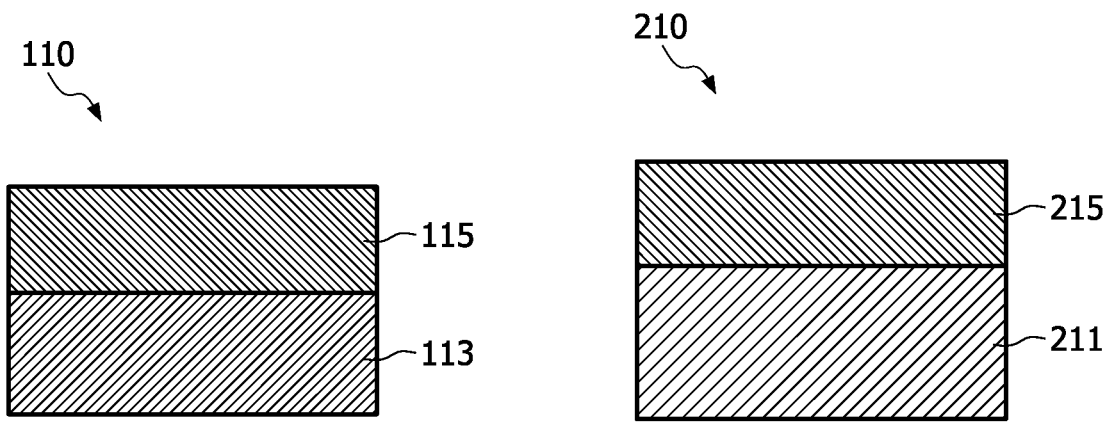

FIG. 2a schematically shows, by way of example, a cross sectional view of the electro-optically active organic layer 110. The electro-optically active organic layer 110 here has a bilayer structure and comprises a hole-transporting layer 113 (HTL), for example of N,N'-diphenyl-N,N'-bis(1-naphthyl)-

1,1'biphenyl-4,4"diamine (aNPD) and a combined electron-transporting and emissive layer 115 (ETL/EML), for example of $Alq_3$. The exemplified structure is per se known and is used in conventional OLEDs. It is an example of a so called small molecule structure. An OLED employing such a structure may be termed a small molecule light emitting diode (smoLED or SM-LED). The organic layers 113, 115 are in a smoLED typically deposited by thermal evaporation or organic vapor phase deposition.

In addition to what has been presented here, it should be understood that a smoLED electro-optically active organic layer 110 may comprise more or less layers, and layers of other organic materials, for example such as are used in conventional smoLEDs.

FIG. 2b schematically shows a cross sectional view of an electro-optically active organic layer 210 that has another bilayer composition than the electro-optically active organic layer 110 of FIG. 2a. The organic layer 210 here comprises an organic HIL 211, for example of poly(3,4-ethylenedioxythiophene) (PEDOT) and a combined ETL/EML 215, for example of polyfluorene (PF). The exemplified structure is per se known and is used in conventional OLEDs. It is an example of a so called large molecule, or polymer structure. An OLED employing such a structure may be termed a polymer light emitting diode (polyLED or PLED). The organic layers 211, 215 are in a polyLED are typically deposited by spin-coating or printing techniques.

In addition to what has been presented here, it should be understood that a polyLED organic layer may comprise more or less layers, and layers of other organic materials, for example such as are used in conventional polyLEDs.

Hence, it should be understood that the present invention is not dependent on any particular electro-optically active organic layer, electro-optically active organic layer structure, composition or material of the electro-optically active organic layer, but that the principles of the invention are applicable and compatible to the vast majority of electro-optically active organic layers such as used in conventional OLEDs and other electro-optically active organic diodes.

Figure 3:
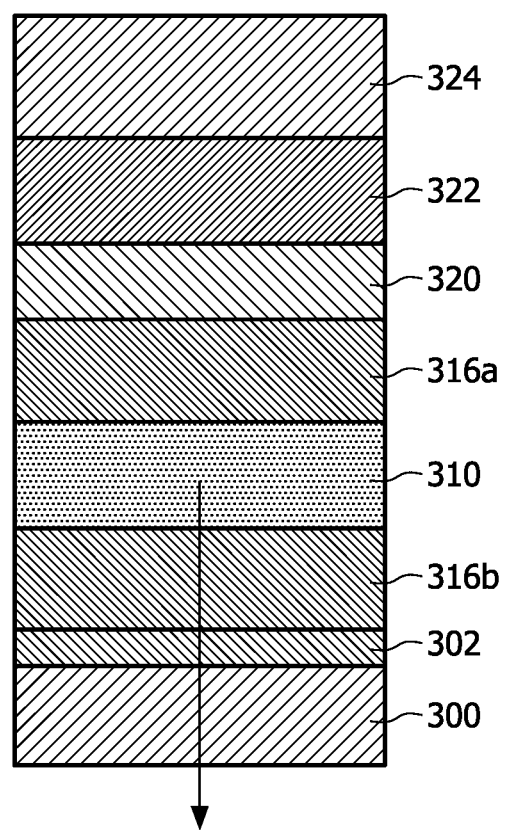
FIG. 3 schematically shows a cross-sectional view of layers in an electro-optically active organic diode according to another embodiment.

FIG. 3 schematically shows a cross-sectional view of layers in an electro-optically active organic diode according to an embodiment where there are two charge carrier organic layers 316a and 316b and a cover layer 324 deposited on and covering a cathode layer 322. Layers 300, 302, 310, 316a, 320 and 322 may correspond to the respective layers 100, 102, 110, 116, 120 and 122 of the embodiment presented in connection with FIG. 1.

The additional charge carrier organic layer 316b is of a highly doped organic semiconductor material, i.e. corresponding to the charge carrier organic layer 316a but of another material. Since the as charge carrier organic layer 316b is arranged between the electro-optically active organic layer 310 and the anode layer 302, it is typically used as an hole injection and/or transport layer and the highly doped organic semiconductor material is p-doped.

The cover layer 324 is preferably of a different but substantially chemically inert material with respect to the material of the cathode layer 322. The cover layer 324 is typically deposited on and completely covers one layer surface of the cathode layer 322. Sharp edge defects, such as pin holes, voids and other defects and damages in the cathode layer 322 surface can be covered and filled by the cover layer 324. One common cathode material that often is impaired by surface defects is Al. The material of the cover layer 324 may have a high dielectric constant that is greater than 1, for example greater than 10 or even 30. It may further be conductive.

In practice it has turned out that desired covering and filling properties of the cover layer 324, which eliminates surface defects and their detrimental impact, can be reached by one of many different materials, inorganic and organic, typically vapor phase deposited. Nevertheless, the materials are preferably thin film packaging materials or glues. Examples of thin film packaging materials are silicon nitride (SiN), silicon carbide (SiC), silicon dioxide ($SiO_2$) and aluminium oxide ($Al_2O_3$), typically deposited by plasma enhanced vapor deposition (PECVD), such as inductively coupled PECVD (IC-PECVD). Glues are preferably of epoxy-type, typically room temperature curable using two solutions, or UV-curable adhesives, typically one solution of epoxy or acrylic type. When a glue is used, the filling and covering properties can be enhanced by reducing vicosity of the glue when it is applied, e.g. by heating to above room temperature, for example 70° C.

In addition to its filling and covering properties, the cover layer 324 may have environmental protection properties, for example by being inert to oxygen and humidity and thus protect the inner layers, e.g. the cathode layer 322 and the short protection layer 320, from these or other substances that can be detrimental but likewise hard to avoid in environments of manufacturing or use. However, environmental protection properties may instead, or also, be provided by a second cover layer (not shown) which may be deposited on the cover layer 324. When a glue is used for the cover layer, the glue may additionally be used for attaching the environmental protection layer, for example a glued glass coverlid as protection against, for example, in-diffusion of water.

Generally, the thickness of the cover layer 324 is not critical as long as there is enough material deposited to fill defects and cover the cathode layer 322 surface. However, the thickness may be about 1000 Å or more.

An electro-optically active organic diode according to the present invention may be used in a lightning device, an organic solar cell device, it can be an organic light emitting diode (OLED) and can be used in a lamp, in a display device, for example in a flat TV, a computer monitor, a digital camera, a mobile phone, and a vast number of other electronic gizmos.

A more specific embodiment will now be exemplified.

An electro-optically active organic diode for use as an OLED comprises a 150 nm ITO layer deposited on a glass substrate, followed by a 100 nm aNPD layer and a 80 nm $Alq_3$ layer. A 10 nm layer of 1,4,2,8-naphthalene tetracarboxylic dianhydride, doped with tetraethyl pyronin chloride in a concentration of 2%, is deposited on the $Alq_3$ layer. A 20 nm BaO layer is deposited on the $Alq_3$ layer and is followed by a 100 nm Al layer. A PECVD deposited 100 nm SiN layer covers the Al layer and eliminates defects in its surface.

The person skilled in the art realizes that the present invention by no means is limited to the embodiments and examples described above. On the contrary, many modifications and variations are possible within the scope of the appended claims.

The invention claimed is:

1. An electro-optically active organic diode, comprising:
   an anode electrode layer;
   a cathode electrode layer;
   an electro-optically active organic layer arranged between the electrode layers;
   a charge carrier organic layer arranged between said electro-optically active organic layer and said cathode electrode layer, and adjacent to said electro-optically active organic layer, said charge carrier organic layer comprising a highly doped organic semiconductor material, dopants thereof being organic molecules; and a short protection layer arranged between said cathode electrode layer and said charge carrier organic layer, and adjacent to said cathode electrode layer, wherein said short protection layer comprises an inorganic semiconductor material and has a thickness of at least 200 Å, wherein the inorganic semiconductor material comprises $La_2O_3$ or $Ce_2O_3$ and wherein the short protection layer is primarily composed of $La_2O_3$ or $Ce_2O_3$.

2. The organic diode as claimed in claim 1, wherein the short protection layer is conducting.

3. The organic diode as claimed in claim 2, wherein the short protection layer is less conducting than the cathode electrode layer.

4. The organic diode as claimed in claim 1, wherein the inorganic semiconductor material of the short protection layer has a higher melting temperature than the material of the cathode electrode layer.

5. The organic diode as claimed in claim 1, wherein the inorganic semiconductor material has a band gap greater than 2.7 eV.

6. The organic diode as claimed in claim 1, wherein the inorganic semiconductor material has an electron affinity between 0.5 eV and 3.5 eV.

7. The organic diode as claimed in claim 1, wherein the inorganic semiconductor material has a dielectric constant greater than 1.

8. The organic diode as claimed in claim 1, further comprising a cover layer arranged in contact with a surface of the cathode layer so that the cathode layer is positioned between the charge carrier organic layer and said cover layer, wherein said cover layer is formed of a substantially inert material with respect to a cathode layer material in contact with said cover layer, and wherein said inert material is deposited on said surface of said cathode layer.

9. The organic diode as claimed in claim 1, wherein the inorganic semiconductor material has a dielectric constant greater than 10.

10. The organic diode as claimed in claim 1, wherein the short protection layer is directly adjacent to the cathode electrode layer.

* * * * *